United States Patent
Hsu et al.

(10) Patent No.: US 10,991,604 B2
(45) Date of Patent: Apr. 27, 2021

(54) METHOD OF MANUFACTURING SEMICONDUCTOR STRUCTURE

(71) Applicant: TAIWAN SEMICONDUCTOR MANUFACTURING COMPANY LTD., Hsinchu (TW)

(72) Inventors: Jyh-Shiou Hsu, Hsin-Chu (TW); Chi-Ming Yang, Hsinchu (TW); Tzu Jeng Hsu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/448,888

(22) Filed: Jun. 21, 2019

(65) Prior Publication Data

US 2020/0035524 A1    Jan. 30, 2020

Related U.S. Application Data

(60) Provisional application No. 62/711,082, filed on Jul. 27, 2018.

(51) Int. Cl.
| | |
|---|---|
| *H01L 21/67* | (2006.01) |
| *H01L 21/768* | (2006.01) |
| *C25D 5/34* | (2006.01) |
| *C25D 7/12* | (2006.01) |
| *C23C 28/02* | (2006.01) |
| *C25D 3/38* | (2006.01) |
| *H01L 23/532* | (2006.01) |

(52) U.S. Cl.
CPC ...... *H01L 21/67201* (2013.01); *C23C 28/023* (2013.01); *C25D 3/38* (2013.01); *C25D 5/34* (2013.01); *C25D 7/123* (2013.01); *H01L 21/6723* (2013.01); *H01L 21/76843* (2013.01); *H01L 21/76873* (2013.01); *H01L 21/76879* (2013.01); *H01L 23/53238* (2013.01)

(58) Field of Classification Search
None
See application file for complete search history.

(56) References Cited

U.S. PATENT DOCUMENTS

2012/0025380 A1 *    2/2012   Neishi ............... C23C 16/40
                                                          257/751

* cited by examiner

*Primary Examiner* — Asok K Sarkar
(74) *Attorney, Agent, or Firm* — WPAT P.C., Intellectual Property Attorneys; Anthony King

(57) ABSTRACT

A method of manufacturing a semiconductor structure includes loading the substrate from a first load lock chamber into a first processing chamber; disposing a conductive layer over the substrate in the first processing chamber; loading the substrate from the first processing chamber into the first load lock chamber; loading the substrate from the first load lock chamber into an enclosure filled with an inert gas and disposed between the first load lock chamber and a second load lock chamber; loading the substrate from the enclosure into the second load lock chamber; loading the substrate from the second load lock chamber into a second processing chamber; disposing a conductive member over the conductive layer in the second processing chamber; loading the substrate from the second processing chamber into the second load lock chamber; and loading the substrate from the second load lock chamber into a second load port.

20 Claims, 10 Drawing Sheets

200

201 — loading a substrate into a first processing chamber

202 — disposing a conductive layer over the substrate in the first processing chamber 203 — unloading the substrate from the first processing chamber 204 — loading the substrate into an enclosure filled with an inert gas 205 — loading the substrate into a second processing chamber 206 — disposing a conductive member over the conductive layer in the second processing chamber 207 — unloading the substrate from the second processing chamber

FIG. 2

METHOD OF MANUFACTURING SEMICONDUCTOR STRUCTURE

PRIORITY CLAIM AND CROSS-REFERENCE

This application claims the benefit of provisional application Ser. 62/711,082 filed on Jul. 27, 2018, entitled "METHOD OF MANUFACTURING SEMICONDUCTOR STRUCTURE," the disclosure of which is hereby incorporated by reference in its entirety.

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as poor electrical interconnection, development of cracks, delamination of components or other issues, resulting in a high yield loss of the semiconductor device. The semiconductor device is produced in an undesired configuration, which would further exacerbate materials wastage and thus increase the manufacturing cost.

Since more different components with different materials are involved, a complexity of the manufacturing operations of the semiconductor device is increased. As such, there is a continuous need to modify a structure of the semiconductor devices and improve the manufacturing operations of the semiconductor devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 is a flow diagram of a method of manufacturing a semiconductor structure in accordance with some embodiments of the present disclosure.

DETAILED DESCRIPTION OF THE DISCLOSURE

Figure 1:
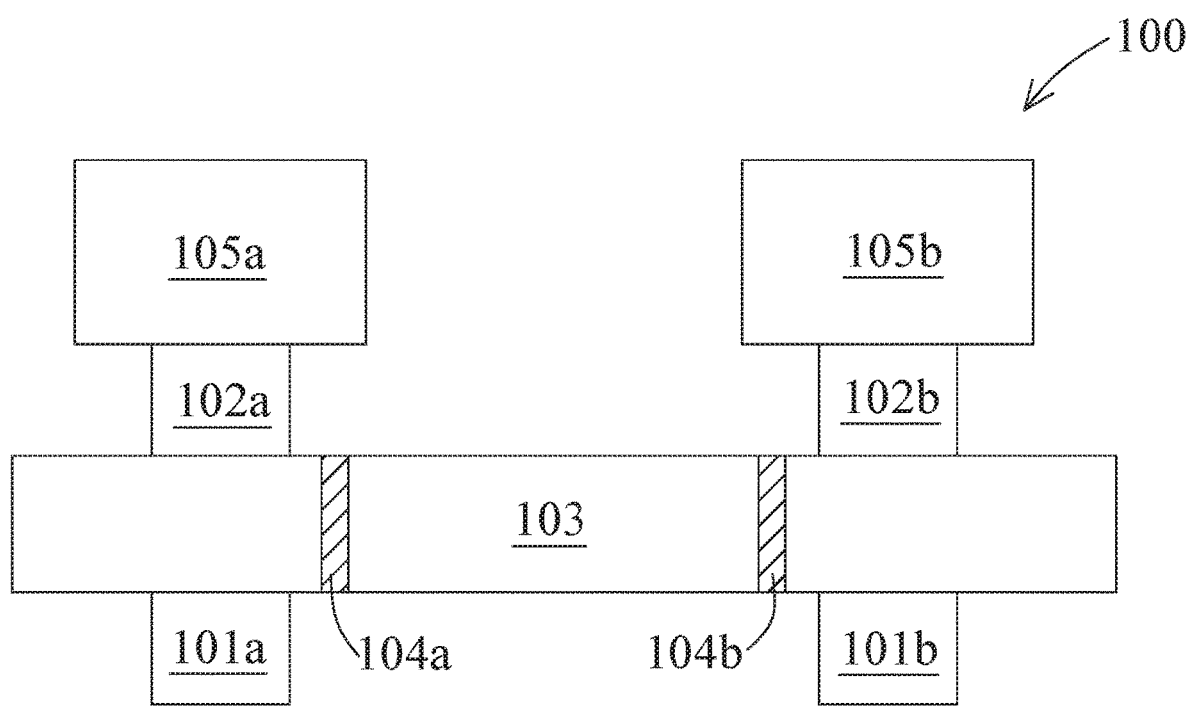
FIG. 1 is a schematic cross sectional view of an apparatus for manufacturing a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure is manufactured by a number of operations. During the manufacturing, a conductive feature is formed over a substrate by several operations. A portion of the substrate is removed to form a recess, a barrier layer is disposed along the recess, a seed layer is then disposed over the barrier layer, and a conductive material disposed over the seed layer and fills the recess to form the conductive feature. However, a void may be formed in the conductive feature if the recess has a high aspect ratio. The void may expand or propagate during thermal cycle. As such, cracks may be developed and would result in a poor electrical connection between components or conductive lines formed on the semiconductor structure.

Further, the seed layer may be oxidized after the formation of the seed layer and before the formation of the conductive feature. An oxidized layer may be formed over the seed layer when the substrate is awaited for the formation of the conductive feature. The oxidized layer may adversely affect the filing of the conductive material. For example, a void may be formed at a center or sidewall of the conductive feature. As a result, the conductive feature may be easily delaminated, and a reliability of the conductive feature or circuitry formed on the semiconductor structure would be decreased.

In the present disclosure, an apparatus for manufacturing a semiconductor structure is disclosed. The apparatus includes an enclosure, a load port coupled with the enclosure, a load lock chamber coupled with the enclosure, and a processing chamber coupled with the load lock chamber and configured to process a substrate or wafer. An inert gas such as nitrogen is injected into the enclosure. The enclosure is filled with the inert gas. The substrate is loaded from the processing chamber to the enclosure and is exposed to the inert gas inside the enclosure. The inert gas can suppress oxidization of conductive material disposed over the substrate. Therefore, oxidization of conductive material disposed over the substrate can be minimized or prevented.

Further, a method of manufacturing a semiconductor structure is disclosed. The method includes loading the substrate into an enclosure filled with an inert gas after disposing of a conductive layer over a substrate. The substrate is exposed to an inert gas such as nitrogen inside the enclosure after the disposing of the conductive layer and before disposing of a conductive member over the conductive layer. As such, oxidization of the conductive layer can be minimized or prevented, and the disposing of the conductive member can be improved.

FIG. 1 is a schematic view of an apparatus 100 in accordance with various embodiments of the present disclosure. In some embodiments, the apparatus 100 includes a first load port 101a, a second load port 101b, a first load lock chamber 102a, a second load lock chamber 102b, an enclosure 103, a first processing chamber 105a and a second processing chamber 105b. In some embodiments, the apparatus 100 is configured to process a substrate or wafer. In some embodiments, the substrate is in a circular shape. In some embodiments, the apparatus 100 is configured to form a conductive feature such as pillar, plug, etc. over the substrate. In some embodiments, the apparatus 100 is a substrate processing system.

In some embodiments, the first load port 101a and the second load port 101b are configured to receive the substrate. In some embodiments, the first load port 101a and the second load port 101b are configured to receive a carrier carrying the substrate. In some embodiments, the carrier can carry several substrates, that the substrates are stacked inside the carrier. In some embodiments, the carrier can be received by the first load port 101a or the second load port 101b. In some embodiments, the carrier is a front opening unified pod (FOUP). In some embodiments, the carrier includes a door, and the door is open when the substrate is loaded out from the carrier. In some embodiments, the door is closed when the substrate is stored inside the carrier. In some embodiments, the first load port 101a and the second load port 101b are under an atmospheric pressure.

In some embodiments, the first load lock chamber 102a and the second load lock chamber 102b are configured to receive the substrate. In some embodiments, the substrate is transferred from the first load port 101a to the first load lock chamber 102a. In some embodiments, each substrate inside the carrier can be loaded from the carrier in the first load port 101a to the first load lock chamber 102a. In some embodiments, the substrate is transferred from the second load port 101b to the second load lock chamber 102b. In some embodiments, each substrate inside the carrier can be loaded from the carrier in the second load port 101b to the second load lock chamber 102b. In some embodiments, the first load lock chamber 102a and the second load lock chamber 102b are in vacuum.

In some embodiments, the enclosure 103 is coupled with the first load port 101a, the second load port 101b, the first load lock chamber 102a and the second load lock chamber 102b. In some embodiments, the enclosure 103 is disposed between the first load lock chamber 102a and the second load lock chamber 102b. In some embodiments, the enclosure 103 is disposed between the first load port 101a and the second load port 101b. In some embodiments, the enclosure 103 is a channel or passage. In some embodiments, the enclosure 103 is filled with an inert gas such as nitrogen, argon, etc. In some embodiments, the enclosure 103 is filled with nitrogen gas. In some embodiments, the enclosure 103 is filled with pure inert gas such as pure nitrogen. In some embodiments, oxygen is absent from the enclosure 103.

In some embodiments, a percentage of nitrogen inside the enclosure 103 is substantially greater than 78% and a percentage of oxygen inside the enclosure 103 is substantially less than 21%. In some embodiments, the percentage of nitrogen inside the enclosure 103 is substantially greater than 85%. In some embodiments, the percentage of nitrogen inside the enclosure 103 is about 100%. In some embodiments, a percentage of oxygen inside the enclosure 103 is substantially less than 15%. In some embodiments, the percentage of oxygen inside the enclosure 103 is substantially less than 1%. In some embodiments, a concentration of oxygen inside the enclosure 103 is substantially less than 100 ppm. In some embodiments, a relative humidity inside the enclosure 103 is substantially less than 1%. In some embodiments, a temperature inside the enclosure 103 is about 20° C.

In some embodiments, the enclosure 103 includes an inlet configured to inject the inert gas into the enclosure 103. In some embodiments, the inlet is connected to the enclosure 103. In some embodiments, the enclosure 103 includes a diffuser configured to diffuse the inert gas throughout the enclosure 103. In some embodiments, the enclosure 103 includes a first slit door 104a disposed at a first end of the enclosure 103 and a second slit door 104b disposed at a second end of the enclosure 103 opposite to the first end of the enclosure. In some embodiments, the first slit door 104a is disposed between the enclosure 103 and the first load lock chamber 102a. In some embodiments, the second slit door 104b is disposed between the enclosure 103 and the second load lock chamber 102b. In some embodiments, the first slit door 104a and the second slit door 104b can isolate the enclosure 103 from the first load port 101a, the second load port 101b, the first load lock chamber 102a and the second load lock chamber 102b.

In some embodiments, a conveying mechanism such as a robotic arm, handling system, etc. is disposed inside the enclosure 103. In some embodiments, the conveying mechanism is configured to load the substrate from the first load port 101a to the first load lock chamber 102a or from the second load port 101b to the second load lock chamber 102b. In some embodiments, the conveying mechanism is configured to load the substrate from the first load lock chamber 102a to the first load port 101a or from the second load lock chamber 102b to the second load port 101b. In some embodiments, the enclosure 103, the first load port 101a, the second load port 101b and the conveying mechanism are part of an equipment front end module (EFEM).

In some embodiments, the first processing chamber 105a is configured to process the substrate. In some embodiments, the first processing chamber 105a is configured to dispose a conductive layer over the substrate. In some embodiments, the first processing chamber 105a is configured to dispose a seed layer over the substrate. In some embodiments, the conductive layer includes copper. In some embodiments, deposition operations are performed inside the first processing chamber 105a. In some embodiments, physical vapor deposition (PVD) or chemical vapor deposition (CVD) operations are performed inside the first processing chamber 105a. In some embodiments, the substrate can be loaded from the first load lock chamber 102a to the first processing chamber 105a. In some embodiments, the substrate can be loaded from the first processing chamber 105a to the first load lock chamber 102a.

In some embodiments, the second processing chamber 105b is configured to process the substrate. In some embodiments, the second processing chamber 105b is configured to dispose a conductive member over the conductive layer disposed in the first processing chamber 105a. In some embodiments, the second processing chamber 105b is configured to form a conductive feature such as pillar, conductive line, plug, etc. over or surrounded by the conductive layer. In some embodiments, the conductive member includes copper. In some embodiments, electroplating operations are performed inside the second processing chamber 105b. In some embodiments, the substrate can be loaded from the second load lock chamber 102b to the second processing chamber 105b. In some embodiments, the substrate can be loaded from the second processing chamber 105b to the second load lock chamber 102b.

In the present disclosure, a method of manufacturing a semiconductor structure is also disclosed. In some embodiments, a semiconductor structure is formed by a method 200. The method 200 includes a number of operations and the description and illustration are not deemed as a limitation as the sequence of the operations. FIG. 2 is an embodiment of the method 200 of manufacturing a semiconductor structure. The method 200 includes a number of operations (201, 202, 203, 204, 205, 206 and 207). In some embodiments, the method 200 is performed by the apparatus 100 described above or shown in FIG. 1.

Figure 3A:
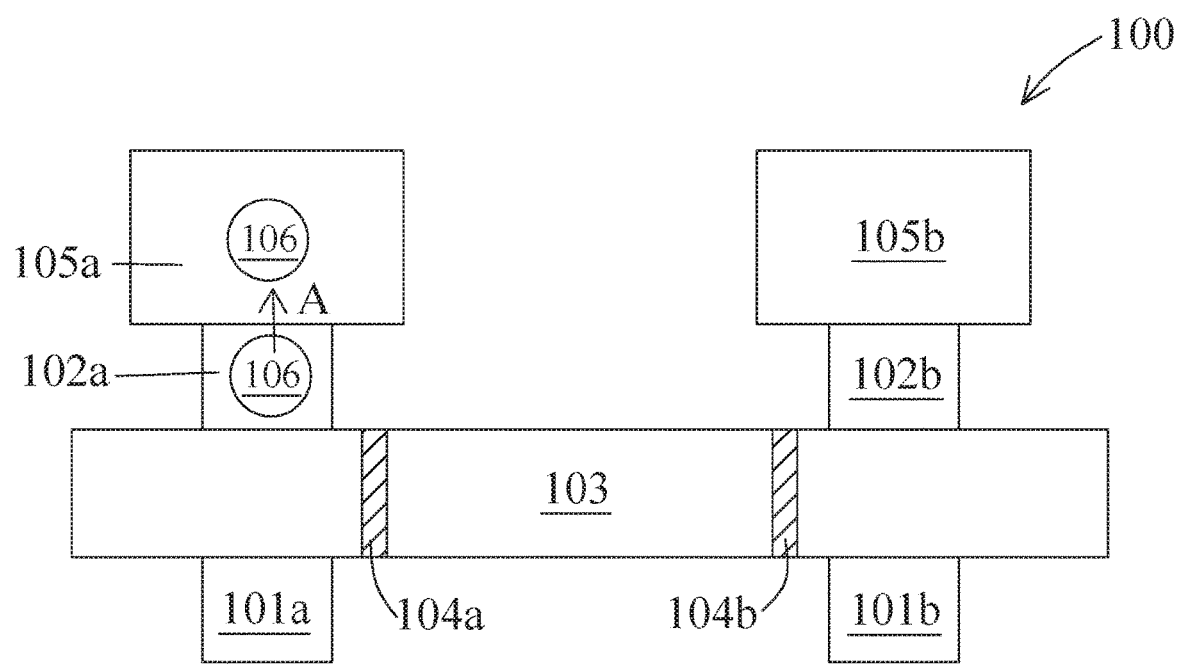
FIGS. 3A-3P are schematic views of manufacturing a semiconductor structure by a method of FIG. 2 in accordance with some embodiments of the present disclosure.

In operation 201, a substrate 106 is loaded into a first processing chamber 105a as shown in FIG. 3A. In some embodiments, the substrate 106 is a wafer. In some embodiments, the substrate 106 includes semiconductive material such as silicon. In some embodiments, the substrate 106 is in a circular shape. In some embodiments, the substrate 106 is disposed inside a first load lock chamber 102a coupled with the first processing chamber 105a. In some embodiments, the first load lock chamber 102a and the first processing chamber 105a are isolated from each other before or after the substrate 106 is loaded into the first processing chamber 105a. In some embodiments, the substrate 106 is conveyed from the first load lock chamber 102a into the first processing chamber 105a as shown by an arrow A in FIG. 3A.

In some embodiments, the substrate 106 is loaded from a first load port 101a coupled with the enclosure 103. In some embodiments, the substrate 106 is loaded from the first load port 101a to the first load lock chamber 102a prior to the loading of the substrate 106 into the first processing chamber 105a. In some embodiments, the substrate 106 is carried by a first carrier. In some embodiments, the first carrier can be received by the first load port 101a. In some embodiments, the first carrier is loaded into the first load port 101a prior to the loading of the substrate 106 from the first load port 101a. In some embodiments, the first carrier is a front opening unified pod (FOUP). In some embodiments, the substrate 106 is loaded from the first carrier in the first load port 101a to the first load lock chamber 102a. In some embodiments, the substrate 106 is loaded from the first load port 101a into the first load lock chamber 102a, and then loaded from the first load lock chamber 102a into the first processing chamber 105a.

Figure 3B:
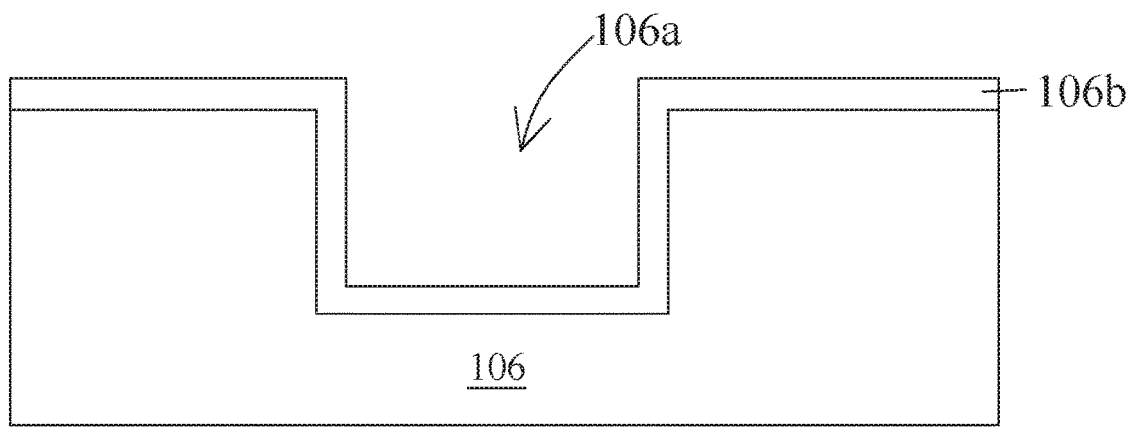

In some embodiments, the first processing chamber 105a is a processing chamber for processing the substrate 106. In some embodiments, deposition operations are performed inside the first processing chamber 105a. In some embodiments, physical vapor deposition (PVD) or chemical vapor deposition (CVD) operations are performed inside the first processing chamber 105a. In some embodiments, the first processing chamber 105a, the first load lock chamber 102a and the first load port 101a have similar configurations as those described above or shown in FIG. 1. In some embodiments, the substrate 106 includes a recess 106a extended into the substrate 106 as shown in FIG. 3B. In some embodiments, the recess 106a is formed prior to the loading of the substrate 106 into the first processing chamber 105a (the operation 201). In some embodiments, the recess 106a is formed by removing a portion of the substrate 106. In some embodiments, the recess 106a is formed by etching, photolithography, etc.

In some embodiments, a barrier layer 106b is disposed over the substrate 106 as shown in FIG. 3B prior to the loading of the substrate 106 into the first processing chamber 105a. In some embodiments, the barrier layer 106b is disposed along the recess 106a. In some embodiments, the barrier layer 106b is disposed by deposition operations such as physical vapor deposition (PVD) or chemical vapor deposition (CVD) operations. In some embodiments, the barrier layer 106b is configured to prevent diffusion of conductive material into the substrate 106. In some embodiments, the barrier layer 106b includes titanium or nitride. In some embodiments, the barrier layer 106b includes titanium nitride.

Figure 3C:
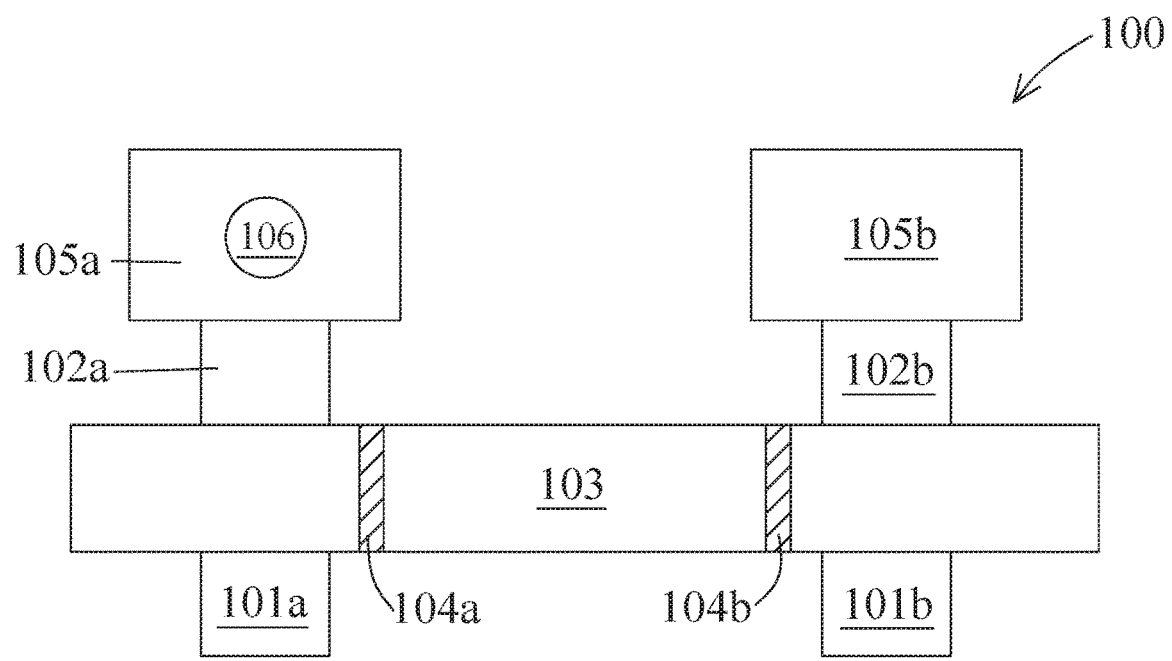
Figure 3D:
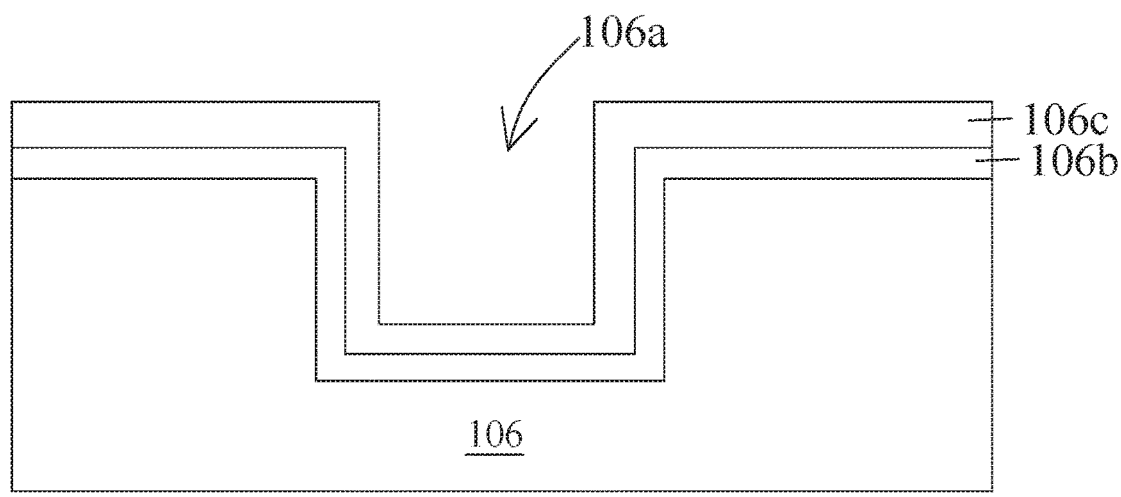

In operation 202, a conductive layer 106c is disposed over the substrate 106 in the first processing chamber 105a as shown in FIGS. 3C and 3D. In some embodiments, the conductive layer 106c is disposed over the substrate 106 after the loading of the substrate 106 from the first load lock chamber 102a into the first processing chamber 105a. In some embodiments, the conductive layer 106c is disposed by PVD, CVD or sputtering operations inside the first processing chamber 105a. In some embodiments, the conductive layer 106c is disposed over the barrier layer 106b. In some embodiments, the conductive layer 106c is disposed along the recess 106a. In some embodiments, the conductive layer 106c includes copper. In some embodiments, the conductive layer 106c is a seed layer.

Figure 3E:
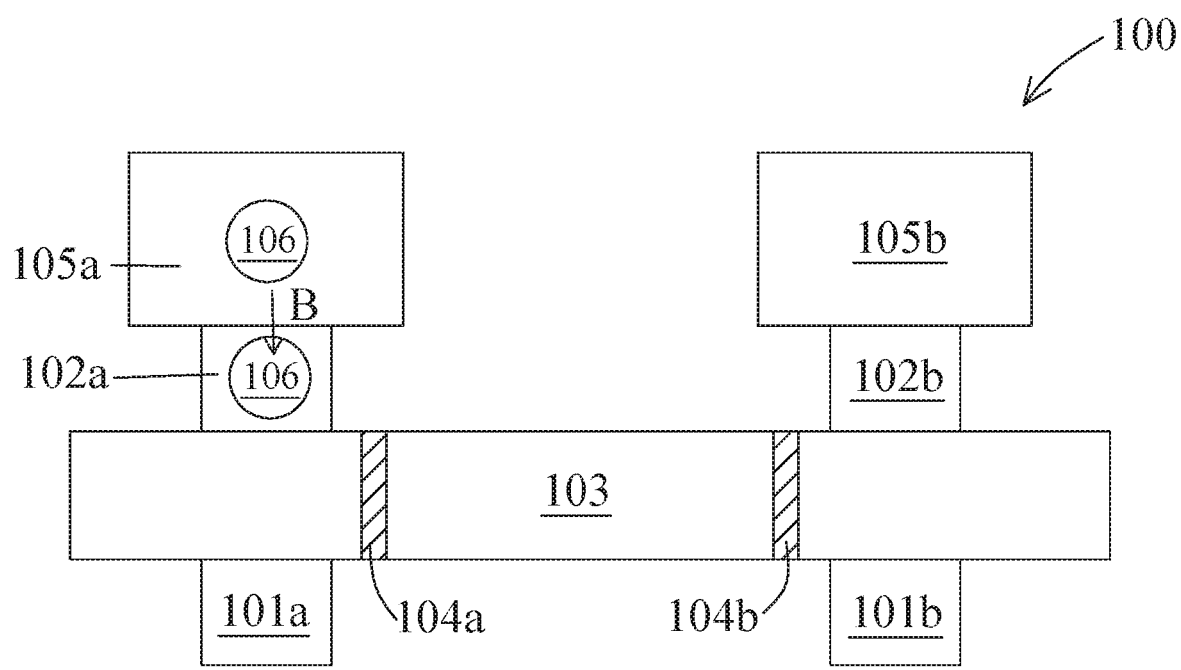
Figure 3F:
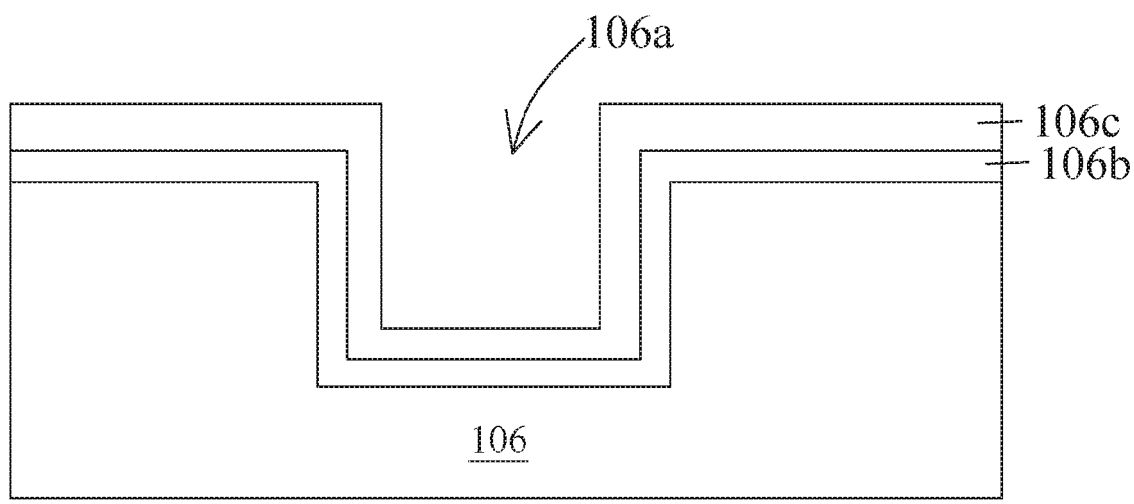

In operation 203, the substrate 106 is unloaded from the first processing chamber 105a as shown in FIG. 3E. In some embodiments, the substrate 106 is unloaded from the first processing chamber 105a after the disposing of the conductive layer 106c over the substrate 106 (the operation 202). In some embodiments, the substrate 106 is conveyed from the first processing chamber 105a into the first load lock chamber 102a as shown by an arrow B in FIG. 3E. In some embodiments, the substrate 106 unloaded from the first processing chamber 105a includes the conductive layer 106c disposed over the substrate 106 as shown in FIG. 3F.

Figure 3G:
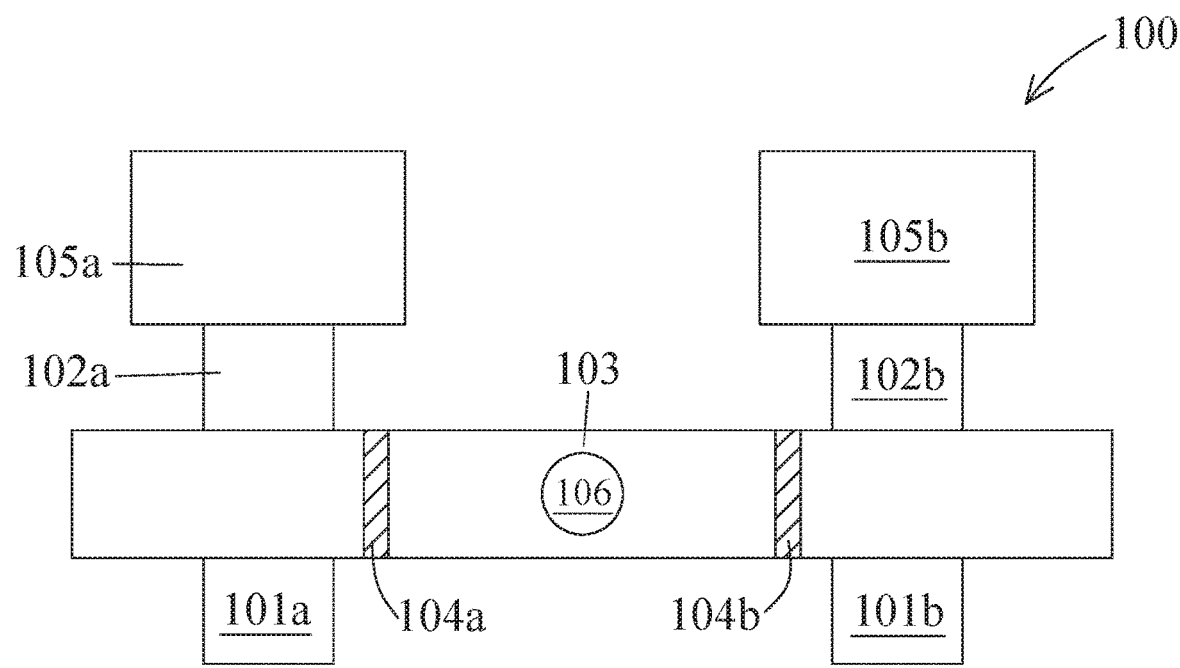
Figure 3H:
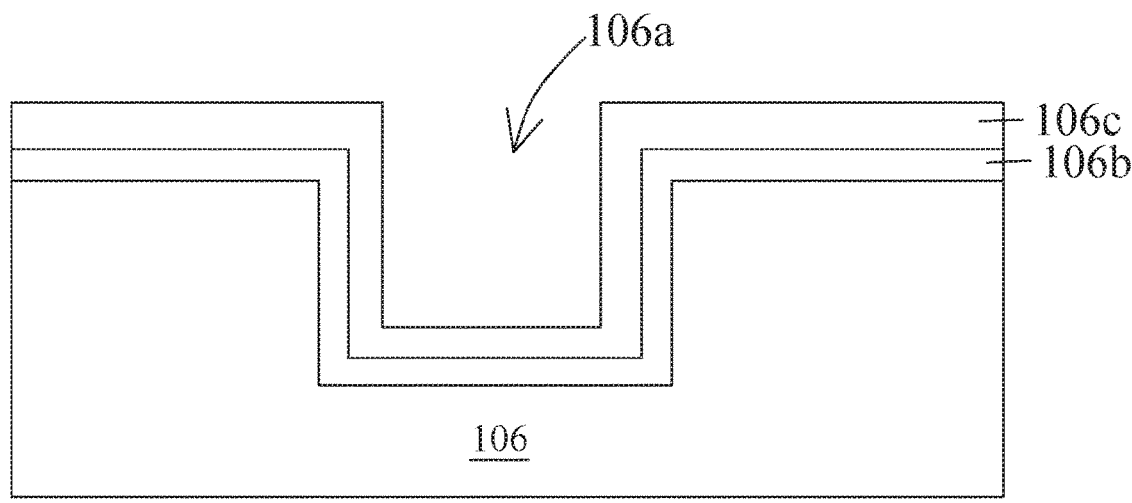

In operation 204, the substrate 106 is loaded into an enclosure 103 as shown in FIG. 3G. In some embodiments, the substrate 106 is loaded into the enclosure 103 after the disposing of the conductive layer 106c over the substrate 106 (the operation 202). In some embodiments, the substrate 106 is loaded from the first load lock chamber 102a into the enclosure 103 after the unloading of the substrate 106 from the first processing chamber 105a (the operation 203). In some embodiments, the substrate 106 loaded into the enclosure 103 includes the conductive layer 106c disposed over the substrate 106 as shown in FIG. 3H. In some embodiments, the substrate 106 is exposed inside the enclosure 103 for a predetermined time.

In some embodiments, the enclosure 103 includes a first slit door 104a disposed at a first end of the enclosure 103 and a second slit door 104b disposed at a second end of the enclosure opposite to the first end of the enclosure 103. In some embodiments, the substrate 106 is disposed between the first slit door 104a and the second slit door 104b after the loading of the substrate 106 into the enclosure 103. In some embodiments, the first slit door 104a is open upon the loading of the substrate 106 from the first load lock chamber 102a into the enclosure 103.

In some embodiments, a predetermined gas is injected into the enclosure 103b prior to the loading of the substrate 106 into the enclosure 103 (the operation 204). In some embodiments, the enclosure 103 is filled with the predetermined gas. In some embodiments, an inert gas is injected into the enclosure 103 before the loading of the substrate 106 into the enclosure 103 (the operation 204). In some embodiments, the enclosure 103 is filled with the inert gas. In some embodiments, the predetermined gas includes nitrogen. In some embodiments, the predetermined gas includes argon. In some embodiments, the enclosure 103 is filled with pure inert gas such as pure nitrogen. In some embodiments, oxygen is absent from the enclosure 103.

In some embodiments, a percentage of nitrogen inside the enclosure 103 is substantially greater than 78% and a percentage of oxygen inside the enclosure 103 is substantially less than 21%. In some embodiments, the percentage of nitrogen inside the enclosure 103 is substantially greater than 85%. In some embodiments, the percentage of nitrogen inside the enclosure 103 is about 100%. In some embodiments, a percentage of oxygen inside the enclosure 103 is substantially less than 15%. In some embodiments, the percentage of oxygen inside the enclosure 103 is substantially less than 1%. In some embodiments, a concentration of oxygen inside the enclosure 103 is substantially less than 100 ppm. In some embodiments, a relative humidity inside the enclosure 103 is substantially less than 1%. Since the substrate 106 is exposed to the inert gas inside the enclosure 103, oxidization of the conductive layer 106c can be minimized or prevented.

In some embodiments, the enclosure 103 includes an inlet configured to inject the inert gas into the enclosure 103. In some embodiments, the inlet is configured to inject nitrogen gas into the enclosure 103. In some embodiments, the enclosure 103 includes a diffuser configured to diffuse the inert gas throughout the enclosure 103. In some embodiments, the enclosure 103 has similar configurations as the one described above or shown in FIG. 1.

Figure 3I:
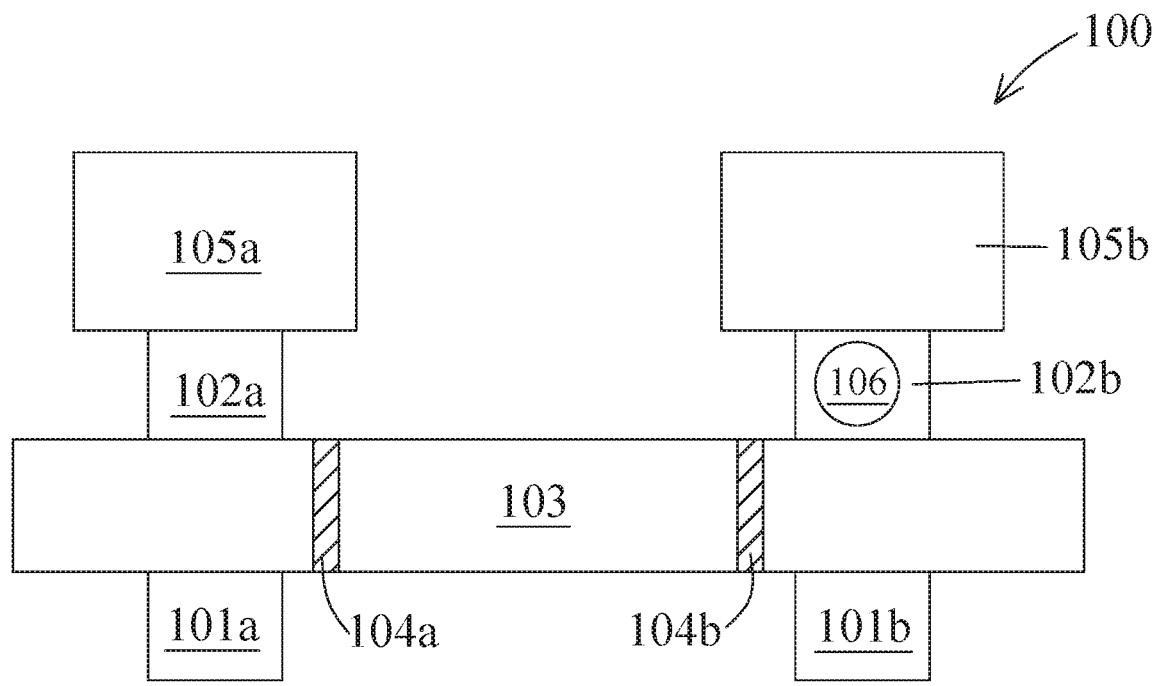
Figure 3J:
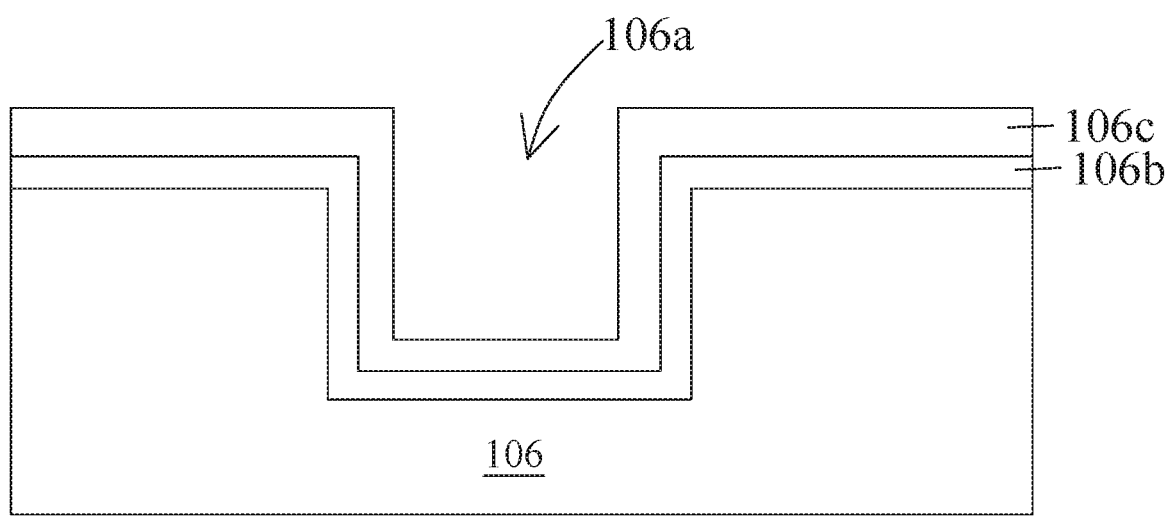

In some embodiments, the substrate 106 is loaded from the enclosure 103 into a second load lock chamber 102b after the loading of the substrate 106 into the enclosure 103 (the operation 204) as shown in FIG. 3I. In some embodiments, the second load lock chamber 102b is coupled with the enclosure 103. In some embodiments, the second slit door 104b is open upon the loading of the substrate 106 from the enclosure 103 into the second load lock chamber 102b. In some embodiments, the substrate 106 is transferred from the first load lock chamber 102a to the second load lock chamber 102b through the enclosure 103. In some embodiments, the substrate 106 loaded into the second load lock chamber 102b includes the conductive layer 106c disposed over the substrate 106 as shown in FIG. 3J.

Figure 3K:
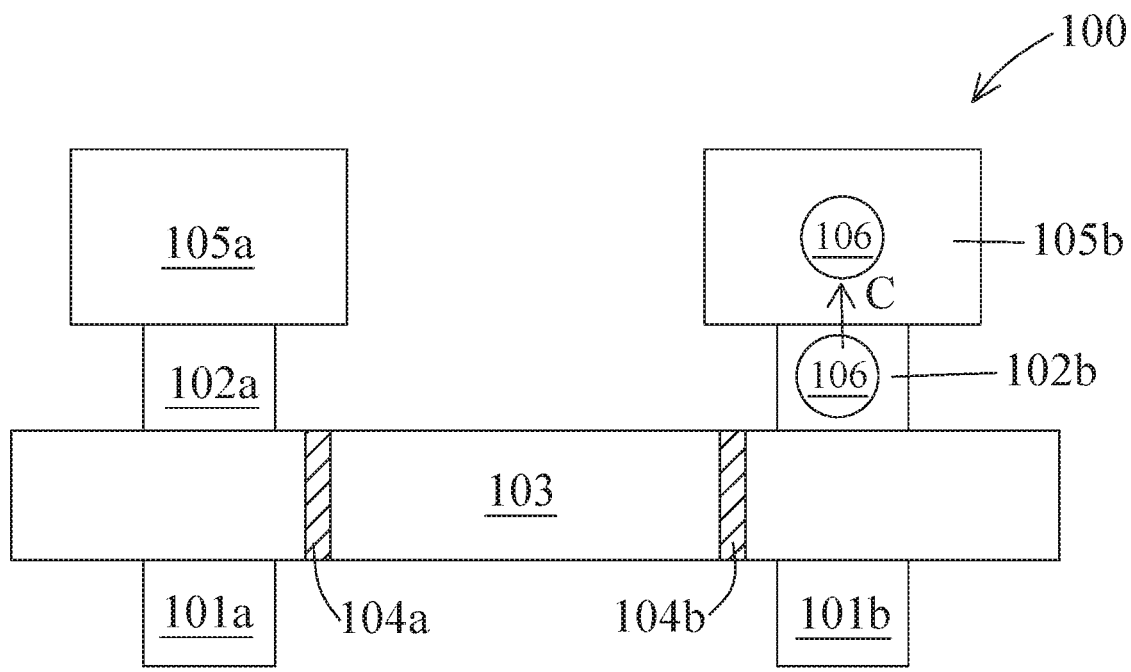

In operation 205, the substrate 106 is loaded into a second processing chamber 105b as shown in FIG. 3K. In some embodiments, the substrate 106 is disposed inside the second load lock chamber 102b coupled with the second processing chamber 105b. In some embodiments, the second load lock chamber 102b and the second processing chamber 105b are isolated from each other before or after the substrate 106 is loaded into the second processing chamber 105b. In some embodiments, the substrate 106 is conveyed from the second load lock chamber 102b into the second processing chamber 105b as shown by an arrow C in FIG. 3K.

Figure 3L:
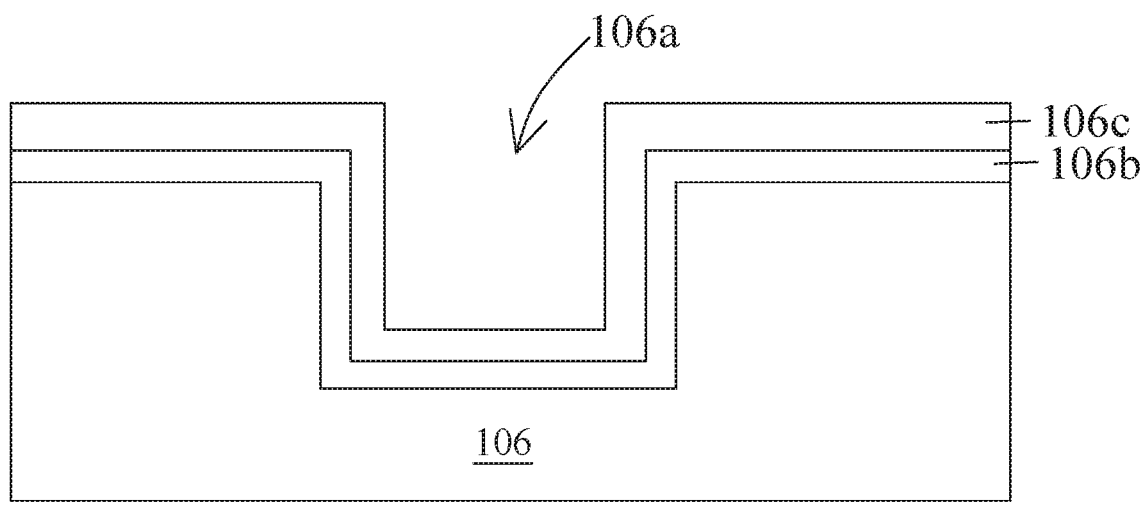

In some embodiments, the second processing chamber 105b is a processing chamber for processing the substrate 106. In some embodiments, electroplating operations are performed inside the second processing chamber 105b. In some embodiments, the second processing chamber 105b and the second load lock chamber 102b have similar configurations as those described above or shown in FIG. 1. In some embodiments, the substrate 106 loaded into the second processing chamber 105b includes the conductive layer 106c disposed over the substrate 106 as shown in FIG. 3L. In some embodiments, the second processing chamber 105b and the second load lock chamber 102b have similar configurations as those described above or shown in FIG. 1.

Figure 3M:
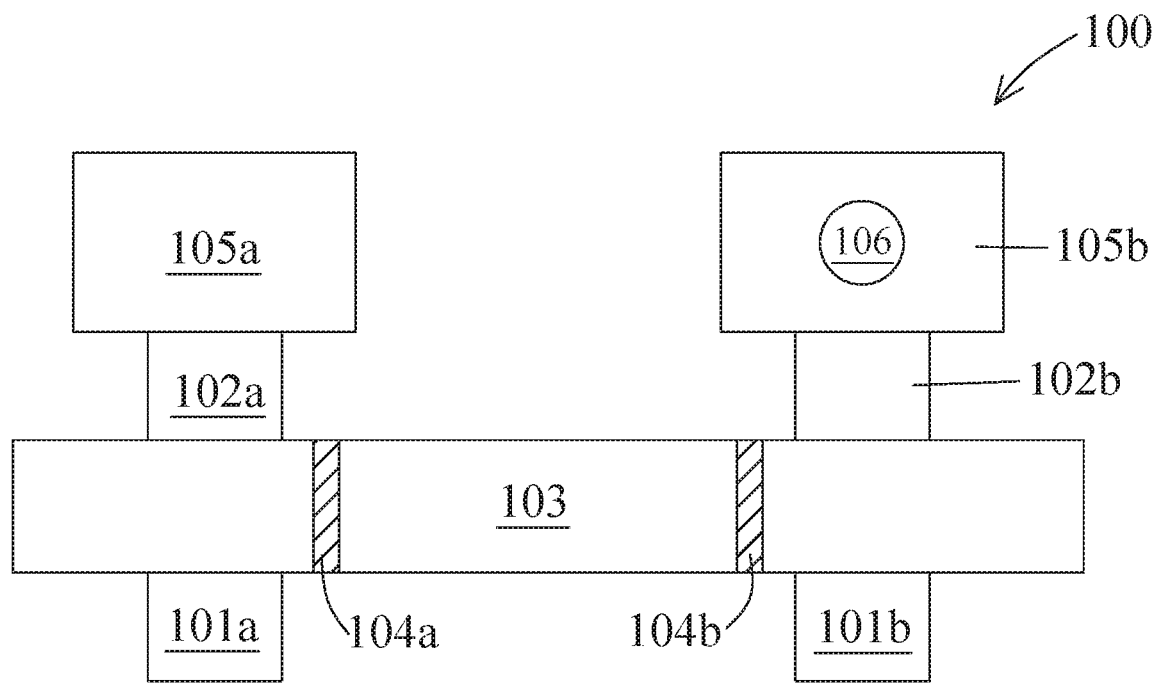
Figure 3N:
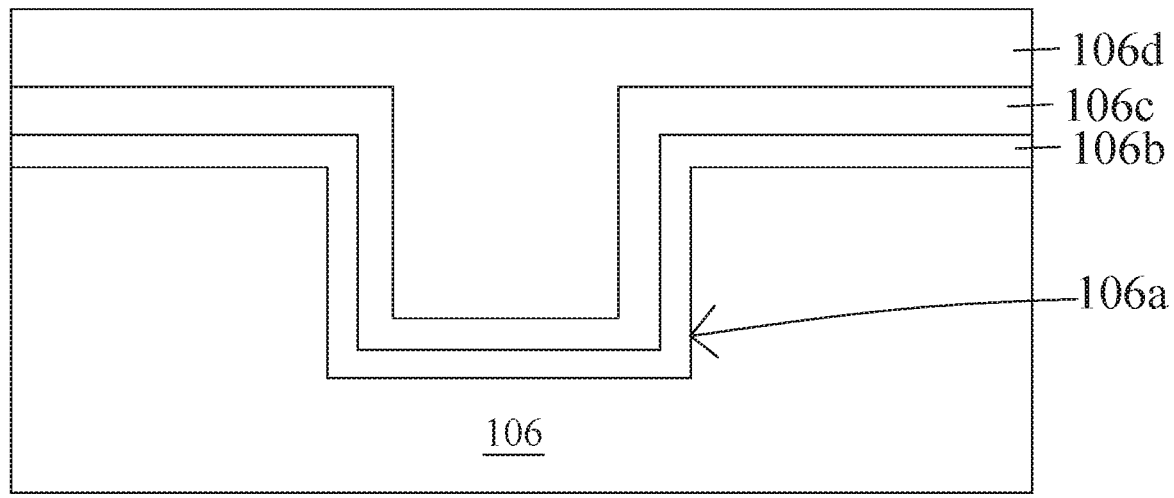

In operation 206, a conductive member 106d is disposed over the conductive layer 106c in the second processing chamber 105b as shown in FIGS. 3M and 3N. In some embodiments, the conductive member 106d is disposed by electroplating operations inside the second processing chamber 105b. In some embodiments, the conductive member 106d is disposed over the conductive layer 106c after the loading of the substrate 106 from the second load lock chamber 102b into the second processing chamber 105b. In some embodiments, the conductive member 106d is disposed along and within the recess 106a. In some embodiments, at least a portion of the conductive member 106d is surrounded by the conductive layer 106c.

In some embodiments, the conductive member 106d includes copper. In some embodiments, the conductive member 106d is a conductive feature such as plug, pillar, conductive line, etc. Since the enclosure 103 filled with the inert gas can suppress or prevent oxidization of the conductive layer 106c, the disposing of the conductive member 106d can be improved. A void present in the conductive member 106d is minimized or prevented.

Figure 3O:
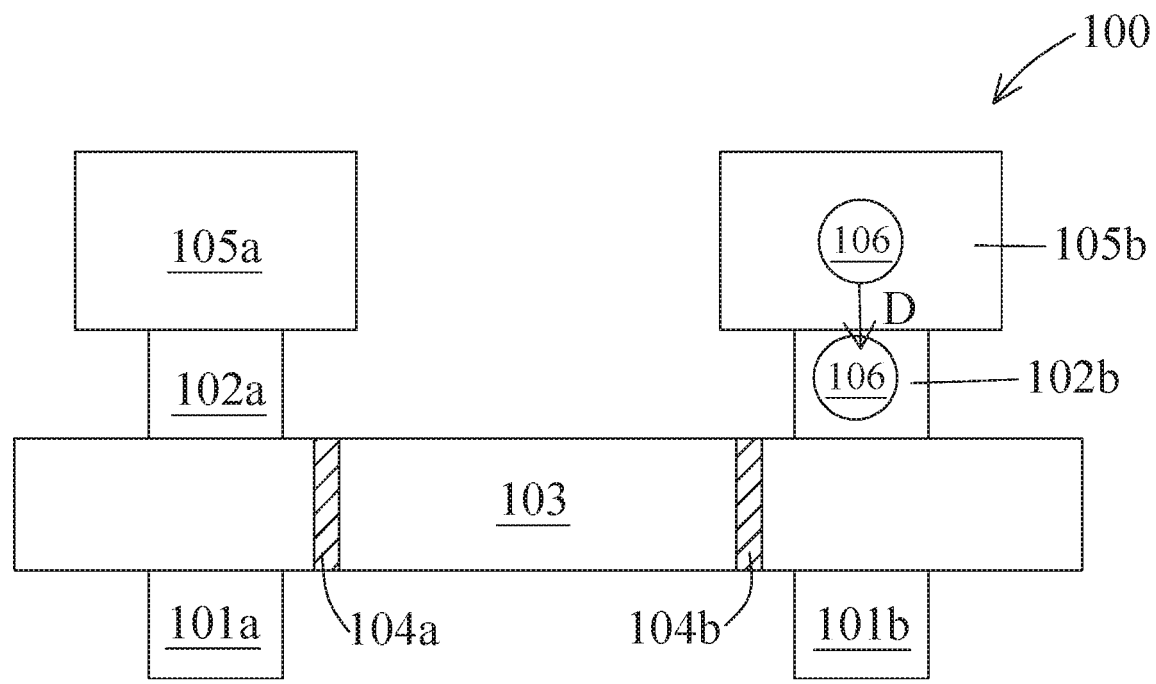
Figure 3P:
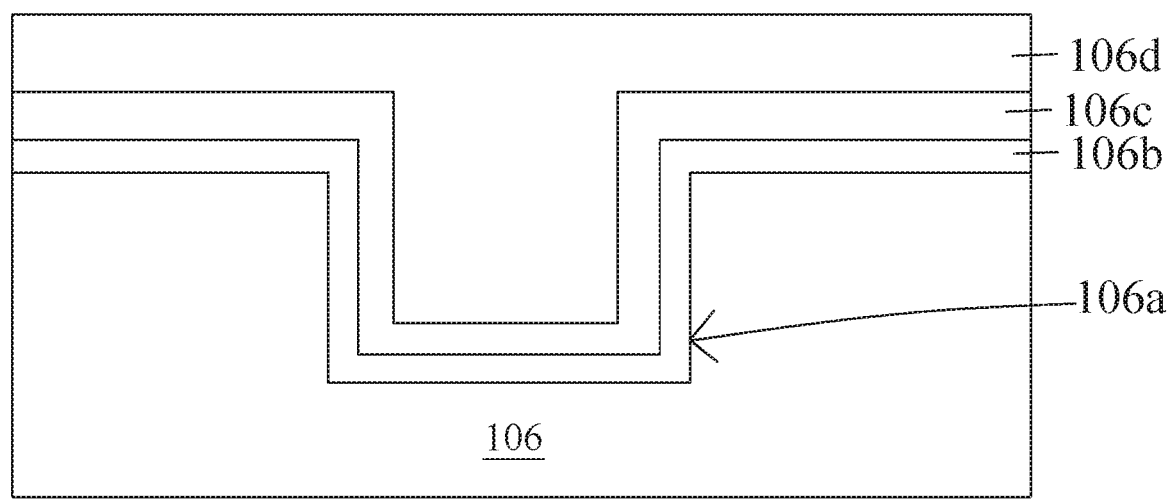

In operation 207, the substrate 106 is unloaded from the second processing chamber 105b as shown in FIG. 3O. In some embodiments, the substrate 106 is unloaded from the second processing chamber 105b after the disposing of the conductive member 106d over the substrate 106 (the operation 206). In some embodiments, the substrate 106 is conveyed from the second processing chamber 105b into the second load lock chamber 102b as shown by an arrow D in FIG. 3O. In some embodiments, the substrate 106 unloaded from the second processing chamber 105b includes the conductive member 106d disposed over the substrate 106 as shown in FIG. 3P. In some embodiments, some portions of the conductive layer 106c and the conductive member 106d disposed out of the recess 106a are removed.

In some embodiments, the substrate 106 is loaded from the second load lock chamber 102b to a second load port 101b coupled with the enclosure 103. In some embodiments, the substrate 106 is loaded from the second load lock chamber 102b to the second load port 101b after the loading of the substrate 106 from the second processing chamber 105b. In some embodiments, the substrate 106 is loaded from the second processing chamber 105b to the second load lock chamber 102b, and then loaded from the second load lock chamber 102b into the second load port 101b. In some embodiments, the substrate 106 is loaded from the second load lock chamber 102b into a second carrier in the second load port 101b after the loading of the substrate 106 from the second processing chamber 105b into the second load lock chamber 102b. In some embodiments, the second carrier can be received by the second load port 101b. In some embodiments, the second carrier is loaded into the second load port 101b prior to the loading of the substrate 106 from the second load lock chamber 102b into the second load port 101b. In some embodiments, the second carrier is a FOUP. In some embodiments, the second load port 101b has similar configurations as those described above or shown in FIG. 1.

In the present disclosure, an apparatus for manufacturing a semiconductor structure is disclosed. The apparatus includes an enclosure filled with an inert gas. A substrate is exposed to the inert gas inside the enclosure. Therefore, oxidization of conductive material disposed over the substrate can be minimized or prevented. Further, a method of manufacturing a semiconductor structure is disclosed. The method includes loading a substrate into an enclosure filled with an inert gas. The substrate is exposed to the inert gas inside the enclosure. As such, oxidization of conductive material disposed over the substrate can be suppressed or prevented. As a result, subsequent disposing of conductive member over the substrate can be improved.

In some embodiments, a method of manufacturing a semiconductor structure includes loading a substrate into a first load port; loading the substrate from the first load port into a first load lock chamber; loading the substrate from the first load lock chamber into a first processing chamber; disposing a conductive layer over the substrate in the first processing chamber; loading the substrate from the first processing chamber into the first load lock chamber; loading the substrate from the first load lock chamber into an enclosure filled with an inert gas and disposed between the first load lock chamber and a second load lock chamber; loading the substrate from the enclosure into the second load lock chamber; loading the substrate from the second load lock chamber into a second processing chamber; disposing a conductive member over the conductive layer in the second processing chamber; loading the substrate from the second processing chamber into the second load lock chamber; and loading the substrate from the second load lock chamber into a second load port.

In some embodiments, the inert gas is nitrogen. In some embodiments, the disposing of the conductive member includes electroplating operations. In some embodiments, the disposing of the conductive layer includes physical vapor deposition (PVD), chemical vapor deposition (CVD) or sputtering operations. In some embodiments, the conductive layer and the conductive member includes copper. In some embodiments, the method further includes injecting the inert gas into the enclosure or exposing the substrate inside the enclosure for a predetermined time.

In some embodiments, the enclosure includes an inlet configured to inject the inert gas into the enclosure, and a diffuser configured to diffuse the inert gas throughout the enclosure. In some embodiments, the substrate includes a recess extended into the substrate, the conductive layer is disposed along the recess, and the conductive member is disposed within the recess. In some embodiments, at least a portion of the conductive member is surrounded by the conductive layer. In some embodiments, a relative humidity inside the enclosure is substantially less than 1%.

In some embodiments, a method of manufacturing a semiconductor structure includes loading a substrate into a first load port; loading the substrate from the first load port into a first load lock chamber; loading the substrate from the first load lock chamber into a first processing chamber; disposing a seed layer over the substrate in the first processing chamber; loading the substrate from the first processing chamber into the first load lock chamber; injecting a predetermined gas into an enclosure coupled with the first load lock chamber and a second load lock chamber; loading the substrate from the first load lock chamber into the enclosure filled with the predetermined gas; loading the substrate from the enclosure into the second load lock chamber; loading the substrate from the second load lock chamber into a second processing chamber; disposing a conductive member over the seed layer in the second processing chamber; loading the substrate from the second processing chamber into the second load lock chamber; and loading the substrate from the second load lock chamber into a second load port.

In some embodiments, the predetermined gas includes nitrogen. In some embodiments, a concentration of oxygen inside the enclosure is substantially less than 100 ppm. In some embodiments, a percentage of oxygen inside the enclosure is substantially less than 21%, and a percentage of nitrogen inside the enclosure is substantially greater than 78%. In some embodiments, the injection of the predetermined gas is prior to the loading of the substrate from the first load lock chamber into the enclosure. In some embodiments, a barrier layer is disposed over the substrate prior to the loading of the substrate into the first load port, and the seed layer is disposed over the barrier layer upon the disposing of the seed layer. In some embodiments, the barrier layer includes titanium or nitride.

In some embodiments, a method of manufacturing a semiconductor structure includes providing a first carrier carrying a substrate; loading the first carrier into a first load port; loading the substrate from the first carrier into a first load lock chamber; loading the substrate from the first load lock chamber into a first processing chamber; disposing a seed layer over the substrate in the first processing chamber; loading the substrate from the first processing chamber into the first load lock chamber; loading the substrate from the first load lock chamber into an enclosure filled with an inert gas; loading the substrate from the enclosure into a second load lock chamber; loading the substrate from the second load lock chamber into a second processing chamber; disposing a conductive member over the seed layer in the second processing chamber; loading the substrate from the second processing chamber into the second load lock chamber; and loading the substrate from the second load lock chamber into a second carrier in a second load port.

In some embodiments, transferring the substrate from the first load lock chamber to the second load lock chamber through the enclosure. In some embodiments, the enclosure includes a first slit door disposed at a first end of the enclosure and a second slit door disposed at a second end of the enclosure opposite to the first end of the enclosure, the first slit door is open upon the loading of the substrate from the first load lock chamber into the enclosure, and the second slit door is open upon the loading of the substrate from the enclosure into the second load lock chamber.

In some embodiments, a manufacturing apparatus includes a first processing chamber; a first load lock chamber coupled with the first processing chamber; a second processing chamber; a second load lock chamber coupled with the second processing chamber; an enclosure disposed between the first load lock chamber and the second load lock chamber; an inlet connected to the enclosure and configured to inject an inert gas into the enclosure; a first slit door disposed between the enclosure and the first load lock chamber; and a second slit door disposed between the enclosure and the second load lock chamber.

In some embodiments, the first slit door is disposed at a first end of the enclosure, and the second slit door is disposed at a second end of the enclosure opposite to the first end of the enclosure. In some embodiments, the first slit door and the second slit door isolate the enclosure from the first load lock chamber and the second load lock chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
    loading a substrate into a first load port;
    loading the substrate from the first load port into a first load lock chamber;
    loading the substrate from the first load lock chamber into a first processing chamber;
    disposing a conductive layer over the substrate in the first processing chamber;
    loading the substrate from the first processing chamber into the first load lock chamber;
    loading the substrate from the first load lock chamber into an enclosure filled with an inert gas and disposed between the first load lock chamber and a second load lock chamber;
    loading the substrate from the enclosure into the second load lock chamber;
    loading the substrate from the second load lock chamber into a second processing chamber;
    disposing a conductive member over the conductive layer in the second processing chamber;
    loading the substrate from the second processing chamber into the second load lock chamber; and
    loading the substrate from the second load lock chamber into a second load port.

2. The method of claim 1, wherein the inert gas is nitrogen.

3. The method of claim 1, wherein the disposing of the conductive member includes electroplating operations.

4. The method of claim 1, wherein the disposing of the conductive layer includes physical vapor deposition (PVD), chemical vapor deposition (CVD) or sputtering operations.

5. The method of claim 1, wherein the conductive layer and the conductive member includes copper.

6. The method of claim 1, further comprising:
    injecting the inert gas into the enclosure;
    exposing the substrate inside the enclosure for a predetermined time.

7. The method of claim 1, wherein the enclosure includes an inlet configured to inject the inert gas into the enclosure, and a diffuser configured to diffuse the inert gas throughout the enclosure.

8. The method of claim 1, wherein the substrate includes a recess extended into the substrate, the conductive layer is disposed along the recess, and the conductive member is disposed within the recess.

9. The method of claim 1, wherein at least a portion of the conductive member is surrounded by the conductive layer.

10. The method of claim 1, wherein a relative humidity inside the enclosure is substantially less than 1%.

11. A method of manufacturing a semiconductor structure, comprising:
    loading a substrate into a first load port;
    loading the substrate from the first load port into a first load lock chamber;
    loading the substrate from the first load lock chamber into a first processing chamber;
    disposing a seed layer over the substrate in the first processing chamber;
    loading the substrate from the first processing chamber into the first load lock chamber;
    injecting a predetermined gas into an enclosure coupled with the first load lock chamber and a second load lock chamber;
    loading the substrate from the first load lock chamber into the enclosure filled with the predetermined gas;
    loading the substrate from the enclosure into the second load lock chamber;
    loading the substrate from the second load lock chamber into a second processing chamber;
    disposing a conductive member over the seed layer in the second processing chamber;
    loading the substrate from the second processing chamber into the second load lock chamber; and
    loading the substrate from the second load lock chamber into a second load port.

12. The method of claim 11, wherein the predetermined gas includes nitrogen.

13. The method of claim 11, wherein a concentration of oxygen inside the enclosure is substantially less than 100 ppm.

14. The method of claim 11, wherein a percentage of oxygen inside the enclosure is substantially less than 21%, and a percentage of nitrogen inside the enclosure is substantially greater than 78%.

15. The method of claim 11, wherein the injection of the predetermined gas is prior to the loading of the substrate from the first load lock chamber into the enclosure.

16. The method of claim 11, wherein a barrier layer is disposed over the substrate prior to the loading of the substrate into the first load port, and the seed layer is disposed over the barrier layer upon the disposing of the seed layer.

17. The method of claim 16, wherein the barrier layer includes titanium or nitride.

18. A method of manufacturing a semiconductor structure, comprising:
    loading a substrate into a first processing chamber;
    disposing a conductive layer over the substrate in the first processing chamber;
    injecting a predetermined gas into an enclosure between the first processing chamber and a second processing chamber;
    loading the substrate into the enclosure filled with the predetermined gas and exposing the substrate to the predetermined gas;
    loading the substrate into the second processing chamber after the exposure of the substrate to the predetermined gas;
    disposing a conductive member over the conductive layer in the second processing chamber; and
    loading the substrate out of the second processing chamber.

19. The method of claim 18, wherein the conductive layer is exposed to the predetermined gas.

20. The method of claim 18, wherein the substrate is conveyed from a first end of the enclosure adjacent to the first processing chamber to a second end of the enclosure opposite to the first end and adjacent to the second processing chamber.

* * * * *